United States Patent
Huang

[11] Patent Number: 5,796,162
[45] Date of Patent: Aug. 18, 1998

[54] FRAMES LOCKING METHOD FOR PACKAGING SEMICONDUCTOR CHIP

[75] Inventor: Chien Ping Huang, Hsin-chu Hsien, Taiwan

[73] Assignee: Greatek Technology Co., Ltd., Hsin-Chu Hsien, Taiwan

[21] Appl. No.: 710,455

[22] Filed: Sep. 17, 1996

[51] Int. Cl.⁶ .................. H01L 23/495; H01L 23/48; H01L 23/52
[52] U.S. Cl. .................. 257/676; 257/666; 257/669; 257/692
[58] Field of Search ................ 257/666, 676, 257/669, 692

[56] References Cited

U.S. PATENT DOCUMENTS

| | | | |
|---|---|---|---|
| 4,252,864 | 2/1981 | Coldren | 257/676 |
| 5,428,247 | 6/1995 | Sohn et al. | 257/676 |
| 5,619,065 | 4/1997 | Kim | 257/673 |

Primary Examiner—Teresa M. Arroyo
Attorney, Agent, or Firm—Fenwick & West LLP

[57] ABSTRACT

The present invention is a mechanism for packaging semiconductor chip which provides ease of assembling and high positioning precision with improved mechanical, electrical and thermal performance. The present invention adopts a die pad frame for supporting the semiconductor chip and a separate lead frame for connection to center part of the semiconductor chip. The semiconductor chip is fixed on the die pad using silver paste, the lead frame conductors are then placed on top of the chip, and the lead frame and the die pad frame containing the chip are assembled with the positioning protrusions of the die pad frame locked and secured by the positioning openings of the lead frame. Subsequently the bonding terminals on the chip are connected to the lead conductors with short gold wires. The frames locking method does not require high precision positioning machines, thereby reducing the assembly cost. The packaged chip contains, from bottom to top, a die pad, the semiconductor chip, a wafer coating, multiple lead conductors and encapsulating material. Since the conductors are placed on top of the semiconductor chip, the positions of the bonding terminals of the chip can be freely designed, and the heat generated by the chip can be dissipated through the conductors more effectively. In addition, because of the adoption of the die pad, the mechanical strength of the packaged chip is improved, while the die pad also helps dissipate the heat generated by the chip.

1 Claim, 9 Drawing Sheets

FRAMES LOCKING METHOD FOR PACKAGING SEMICONDUCTOR CHIP

FIELD OF THE INVENTION

The present invention relates generally to a method for packaging semiconductor chip, having resistance to ingress of environmental contaminants, capability to make electrical contact to chip terminals with short wires, and further, adopting separate die pad frame and lead frame structure for improving mechanical, electrical and thermal performance, and more specifically to a method of efficiently assembling the die pad frame with the lead frame, thereby increasing the positioning precision while reducing the assembling cost.

BACKGROUND OF THE INVENTION

The basic function of semiconductor packaging is to protect the semiconductor chip from the contaminants in the outside environment, provide easy contacts to external circuits, and dissipate the heat generated by the chip. As the competitions grow, electronic devices, especially semiconductor chips, are required to enlarge capacity, reduce size and increase speed. Accordingly, semi-conductor packaging technology are pushed to fulfill these requirements.

Many techniques have been employed to position and affix conductor leads to a semiconductor chip prior to encapsulation of the chip in a protective coating. Traditional techniques employ a lead frame with a central die pad to which the semiconductor chip is attached prior to encapsulation. The chip terminals are located along the peripheries of the chip and are electrically connected to the conductor leads by means of gold wires. The main problems of such a package is that the leads are far away from the terminals on the chip, making the bonding wires long and increasing corresponding resistance, and that the heat generated by the chip can not be easily transferred to the outside.

In order to solve these problems, Pashby et al. disclose a packaging structure in U.S. Pat. No. 4,862,245, issued on Aug. 29, 1989, which places the conductor leads on top of the semiconductor chip, thereby reducing the length of the bonding wires and increasing the heat dissipation efficiency with the help of the conductor leads.

One of the problems with this prior art lead on chip structure is that as the conductors are placed on top of the semiconductor chip, there is no die pad to support the chip, reducing the mechanical strength of the packaged chip. On the other hand, since the conductor leads are longer, their mechanical strength are improved over the traditional packaging structure. Another problem with the lead on chip structure is that since the lead conductors are glued on the chip, they must be positioned precisely, from traditional ±150 μm tolerance down to ±50 μm, requiring expensive high precision mounter to accomplish such a difficult job. Still another problem is that as the lead frame conductors are adhesively attached to the chip, the glue used has to be quite thick, making the effect of out gas in this area more significant. Further, the thick glue may act as a cushion during the operation of wire bonding to the terminals on the chip, reducing the reliability of the bonding procedure.

SUMMARY OF THE INVENTION

The primary object of the present invention is to provide a method for packaging semiconductor chip, having resistance to ingress of environmental contaminants, capability to make electrical contact to chip terminals by means of short wires, with improved electrical, mechanical and thermal performance.

Another object of the present invention is to provide a mechanism for connecting lead conductors to bonding terminals that can be placed arbitrarily on the semi-conductor chip, thereby shortening the length of the bonding wires, saving precious metals and enhancing the signal speed of the chip.

Still another object of the present invention is to provide a method for packaging semiconductor chip, wherein the lead conductors are placed over the semiconductor chip, without the utilization of expensive adhesives to attach the lead conductors to the semiconductor chip, the separation between them being only a layer of protection coating, for further improved electrical, mechanical and thermal performance.

It is a further object of the present invention to provide a method of packaging semiconductor chip, adopting a die pad structure to support the chip for improved mechanical and thermal performance.

It is another object of the present invention to provide a simple mechanism of packaging semiconductor chip, adopting positioning protrusions in the die pad frame and positioning openings in the lead frame, thereby enhancing the assembling efficiency and precision while reducing the operation cost.

To these ends, the present invention provides a die pad frame to support the semiconductor chip and a lead frame having a plurality of conductors extending to the top of the active area of the semiconductor chip. The die pad frame has a three-dimensional structure, with positioning protrusions at both sides connecting to the selvages. The semiconductor chip is attached adhesively on the die pad, with a surface coating to protect it from electrically contacting the lead conductors. The lead frame is then placed on top of the chip, with its positioning openings at both sides of the selvages locked and secured to the positioning protrusions of the die pad frame. Subsequently bonding wires are applied to connect the lead conductors and the terminals on the chip and the entire module is encapsulated with packaging material.

DETAILED DESCRIPTION OF THE PREFERRED EMBODIMENT

Figure 1:
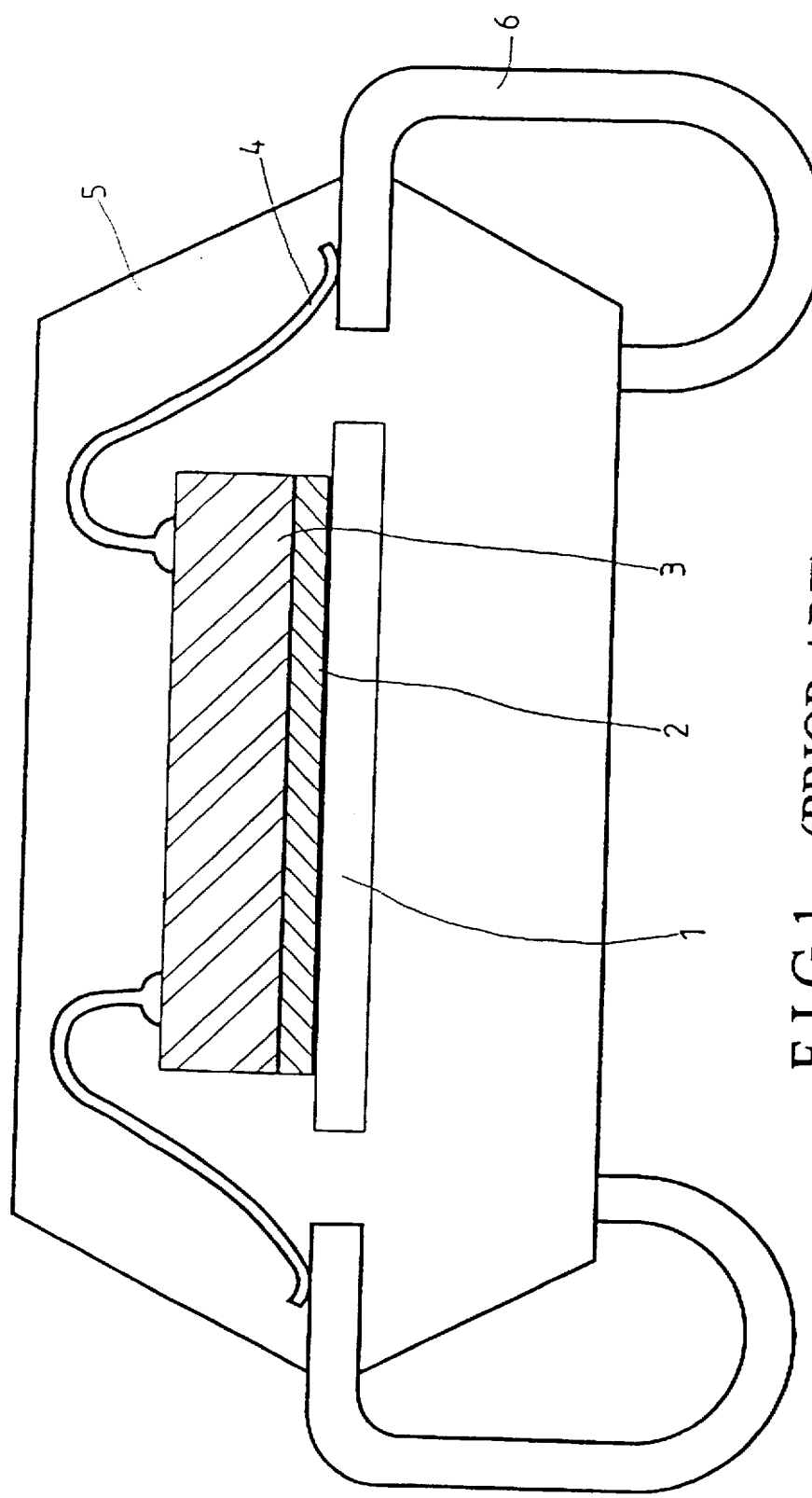
FIG. 1 is a schematic representation of the cross-section of a traditional semiconductor package, including the die pad, the semiconductor chip, the conductor leads, the bonding wires and the encapsulation material.

A traditional encapsulated semiconductor chip is schematically shown with its cross-section in FIG. 1. The semiconductor chip 3 is supported by the die pad 1 and is affixed adhesively to the die pad 1 with silver paste 2. The conductor leads 6 at both sides of the packaged chip are connected by means of bonding wires 4 to the bonding terminals on the edges of the chip. After bonding, the entire module is encapsulated with packaging material 5.

Because a minimum path length of about 0.5 mm to 1 mm is required to assure sealing of the conductor leads in the packaging material 5, the width of the semiconductor module must be 1–2 mm larger than the width of the chip 3. In addition, since the lead conductors 6 and the die pad 1 lie on the same plane, the position of the semiconductor chip 3 is higher than the lead conductors 6. As a result, the bonding wires 4 have to be quite long, and the corresponding resistance is relatively high, limiting the electrical performance of the semiconductor chip 3. Furthermore, the packaging material 5 is usually a poor heat conductor, yet the long thin bonding wires 4 are also inefficient in transferring heat to the conductor leads 6 and thereafter to the outside environment, the result is higher operating temperature and a the reduced semi-conductor chip life.

Figure 2:
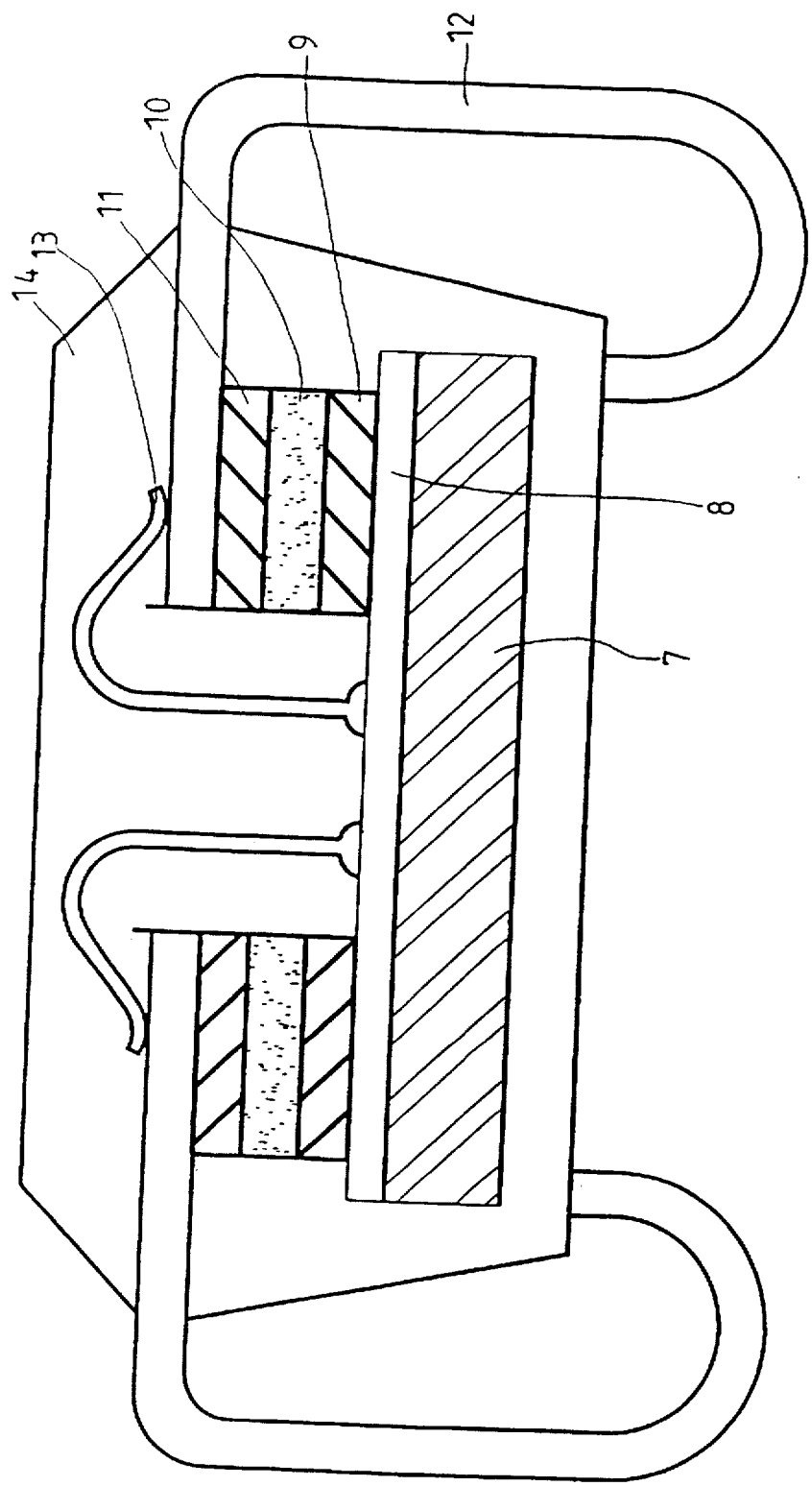
FIG. 2 is a schematic representation of the cross-section of a wire bonded encapsulated semiconductor chip employing the prior art lead on chip structure, comprising the semiconductor chip, the alpha barrier, the adhesives, the conductor leads, the bonding wires and the encapsulation material.

A prior art encapsulated semiconductor chip is schematically shown with its cross-section in FIG. 2. The lead conductors 12 are attached adhesively to a major surface of the semiconductor chip 7, which is protected by a wafer coating 8. In order to further protect the semiconductor chip 7 from being shorted to the lead conductors 12, an alpha barrier 10 is interposed between the lead conductors 12 and the chip 7 and joined to both of them by means of adhesives 9 and 11. Bonding wires 13 connect the bonding terminals on the chip 7 and the lead conductors 12. The lead conductors 12, the alpha barrier 10, the semiconductor chip 7, and the bonding wires 13 are then encapsulated with the packaging material 14 to form a semiconductor module.

Since the lead conductors 12 are affixed on top of the semiconductor chip 7, the length of the bonding wires 13 can be reduced significantly, saving precious metals and improving the high speed response of the chip 7. In addition, as the lead conductors 12 are already long enough for encapsulation strength, the size of the package can be reduced to be just slightly wider than the semiconductor chip 7. Furthermore, as the lead conductors occupy most of the surface area of the semiconductor chip 7, heat generated by the chip 7 can be more efficiently transferred to the outside environment through the lead conductors 12.

During assembling operation, there is no die pad to support the semiconductor chip 7, thus a special precision mounting machine is required so that the semiconductor chip 7 can be placed at the desired position relative to the lead conductors 12. In addition, when connecting the bonding wires 13 to the bonding terminals on the semiconductor chip 7, the lead frame 12 is fixed while the semiconductor chip 7 is attached to the bottom of the lead frame 12. Since the semiconductor chip 7 is not supported from below, the adhesives 9, 11 and alpha barrier 10 will act as a cushion and extend downward, making the bonding less reliable. Furthermore, as there are two adhesive layers 9 and 11, the possibilities of inadvertent impurities in the adhesive layers are higher, making the process control requirements higher for desired product performance.

Figure 3:
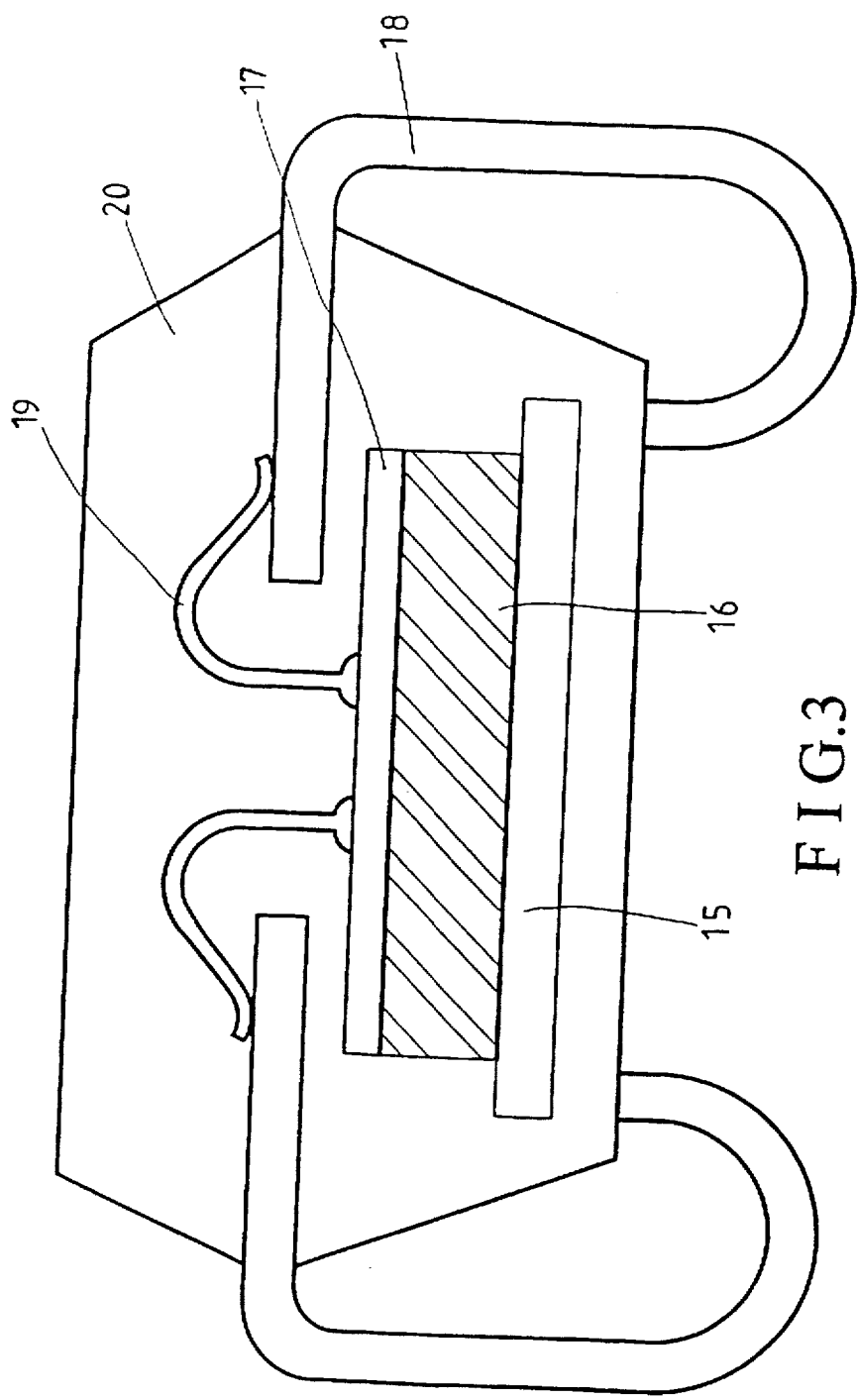
FIG. 3 is a schematic representation of the cross-section of the present invention, including the die pad, the semiconductor chip, the protection coating, the conductor leads, the bonding wires and the encapsulation material.

FIG. 3 is a schematic representation of the cross-section of the present invention intended to solve these problems. The die pad 15 as in conventional structure shown in FIG. 1 is reserved to support the semiconductor chip 16, which is protected with a wafer coating 17. The lead conductors 18 extend over the top of the semiconductor chip 16 as in the prior art structure shown in FIG. 2, and bonding wires 19 connect the lead conductors 18 to the bonding terminals on the chip 16.

When compared to the prior art structures shown in FIG. 1 and FIG. 2, the present invention preserves the advantages of the die pad and the lead on chip structure. In addition, since the lead conductors 18 are not adhesively attached to the semiconductor chip 16, the alpha barrier 10 and the corresponding adhesives 9 and 11 in FIG. 2 are not necessary, saving the operations of placing the alpha barrier and the adhesives. Furthermore, the application of adhesives usually requires a heating procedure, during which the performance of the semiconductor chip will be degraded. Another advantage of the present invention is that as the barrier between the lead conductors 18 and the semiconductor chip 16 is only one layer of protection coating 17, the length of the bonding wires 19 are shorter than those of the prior art structure as shown in FIG. 2. As a result, the electrical signal bandwidth is enhanced and the efficiency of heat transfer to the lead conductors 18 is higher than that of the prior art structure of FIG. 2.

Figure 4:
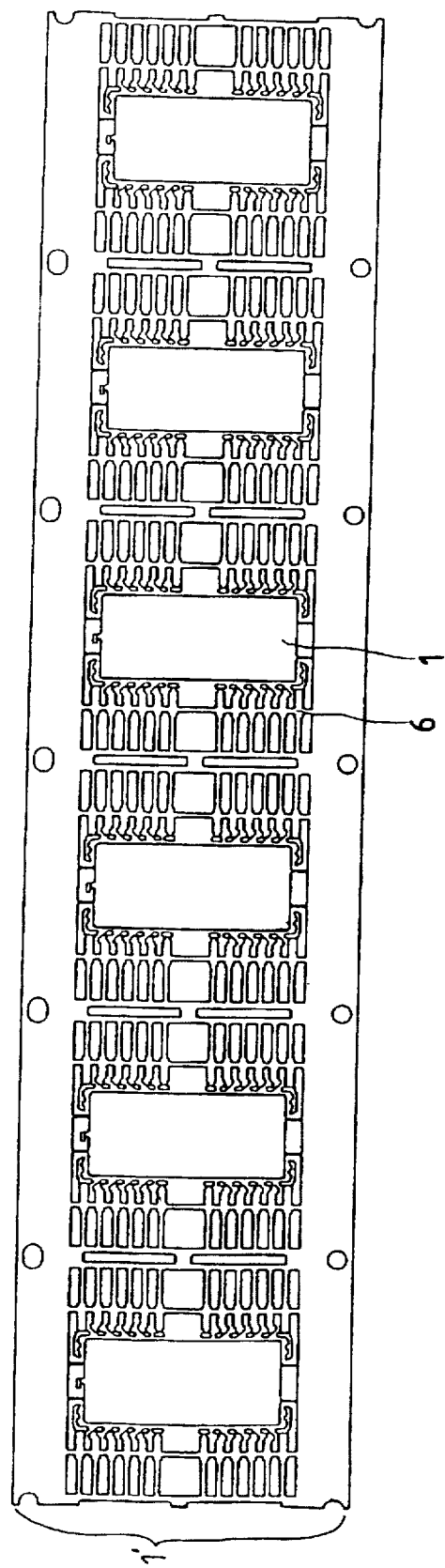
FIG. 4 is a schematic representation of the top view of a traditional lead frame, the center tab is used for supporting the semiconductor chip, while leads are located around the periphery.

A traditional lead frame is shown schematically in FIG. 4. The lead frame 1' contains a central die pad 1 that supports and positions the semiconductor chip for stability during subsequent wire bonding and encapsulation operations. As the die pad 1 occupies the central part of the lead frame, the lead conductors 6 can only be placed at the peripheries of the die pad 1. Because the die pad 1 is made of metal, it will help dissipate the heat generated by the semiconductor chip. The transfer of heat from the active region of the semiconductor chip to the die pad 1, however, is usually not efficient. Therefore, the heat generated in the active region of the semiconductor chip will also need to pass through the bonding wires and the lead conductors 6 to the outside environment. Since the die pad 1 and the lead conductors 6 lie on the same plane, the bonding wires have to be long, increasing the heat conductance and limiting the thermal performance of the semiconductor chip module. In addition, the longer bonding wire also increases resistance and degrading the electrical performance of the semiconductor chip.

In order to shorten the bonding wires and improve heat dissipation while preserving the die pad for better mechanical performance, the die pad and the lead frame must lie on different planes. This can be accomplished by adopting two different frames, one being the die pad frame and the other the lead frame. The positioning between the two frames, however, must be carefully designed to render high precision and ease of assembling. This is achieved in the present invention as described in detail in the following.

Figure 5A:
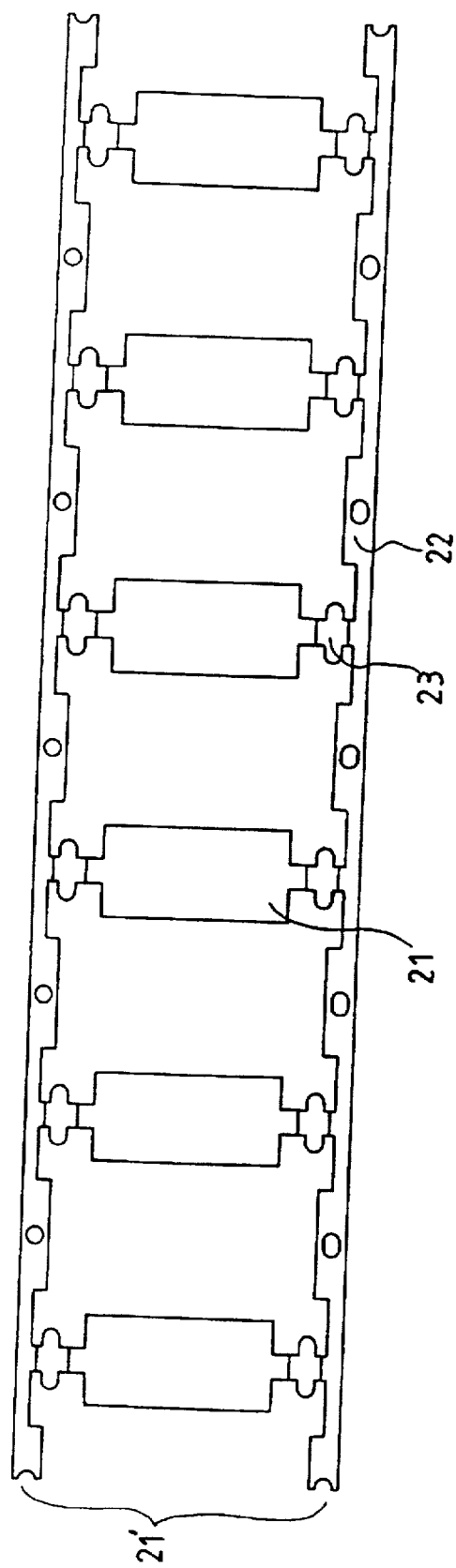
FIG. 5A is a schematic representation of the top view of the die pad frame of the present invention, containing central tab for supporting the semiconductor chip and positioning protrusions at both sides connecting to the selvage area for assembly positioning.

The die pad frame of the present invention is exhibited in FIG. 5. FIG. 5A is a schematic representation of the top view of the die pad frame of the present invention. The die pad frame 21' contains die pads 21 to hold up the semiconductor chip, and the different die pads 21 are connected by means of selvages 22 at both ends for mass-production. Positioning protrusions 23 connect the die pad 21 and the selvages 22. The positioning protrusions 23 are higher than the die pad in order to assist in assembling the die pad frame with the lead frame.

Figure 5B:
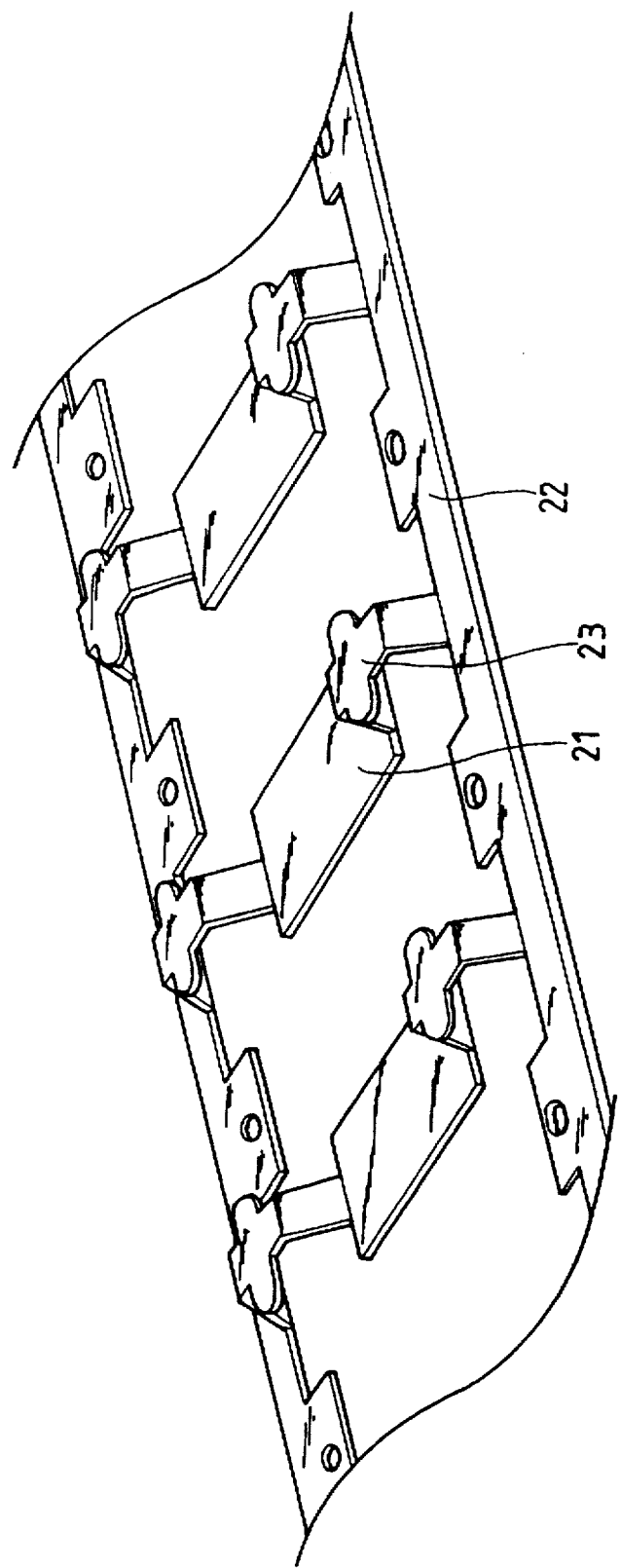
FIG. 5B is a schematic representation of the die pad frame of the present invention, showing the three-dimensional structure.

The three-dimensional structure of the die pad frame of the present invention is illustrated in FIG. 5B in order for the viewer to more clearly understand the design of the present invention. The die pads 21 and the selvages 22 are located on the same plane, while the positioning protrusions 23 are higher by the thickness of the lead frame.

Figure 6:
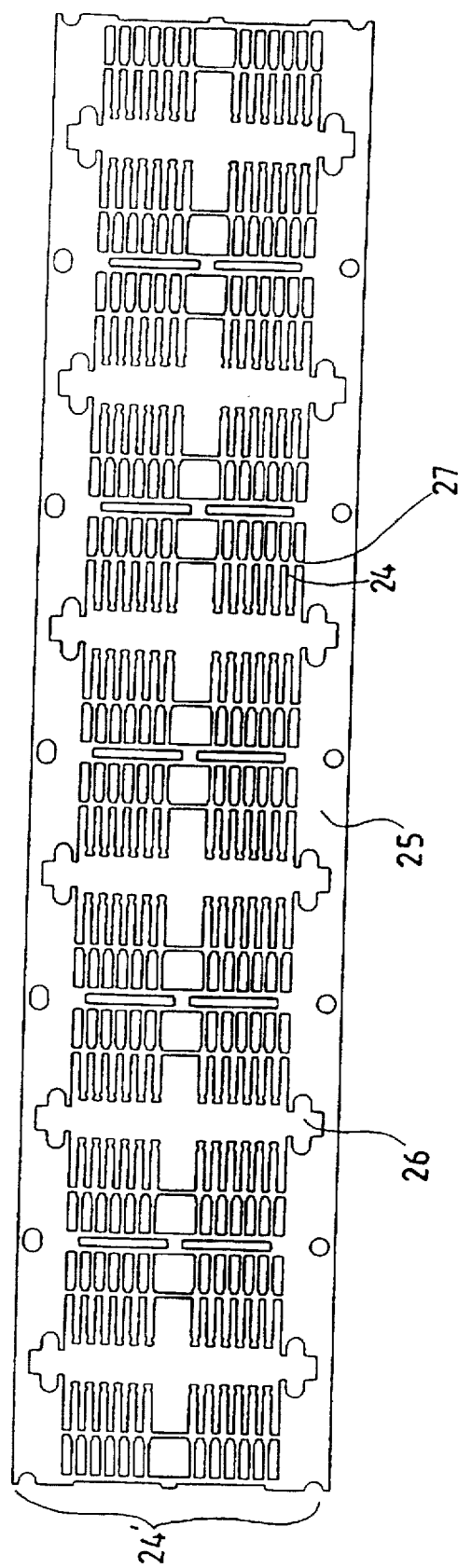
FIG. 6 is a schematic representation of the top view of the lead frame of the present invention, including conductor leads extending to center portion of the chip and positioning openings at both sides in the selvage area.

FIG. 6 shows schematically the top view of the lead frame of the present invention. The lead frame 24' contains lead conductors 24, which are connected by cross members 27. The cross members 27 are removed after assembling, bonding and encapsulation. The lead conductors 24 for each semiconductor chip are fastened by selvages 25 for mass-production. At both sides of the selvages 25 are positioning openings 26, which occupy the same locations as the positioning protrusions 23 in the die pad frame 21' shown in FIG. 5A. The shape of the positioning openings 26 are also the same as that of the positioning protrusions 23 in the die pad frame 21'.

During assembling operation, the semiconductor chips are attached adhesively on the die pads 21 in the die pad frame 21', with the help of traditional mounter. The lead frame 24' is then placed on the die pad frame 21', with the positioning protrusions 23 of the die pad frame 21' plugged into the positioning openings 26 of the lead frame 24'. Once the die pad frame 21' and the lead frame 24' are connected, the lead conductor db will extend on top of the semiconductor chip, allowing bonding wires to connect the lead conductors 24 to bonding terminals in the central portion of the semiconductor chip.

Figure 7:
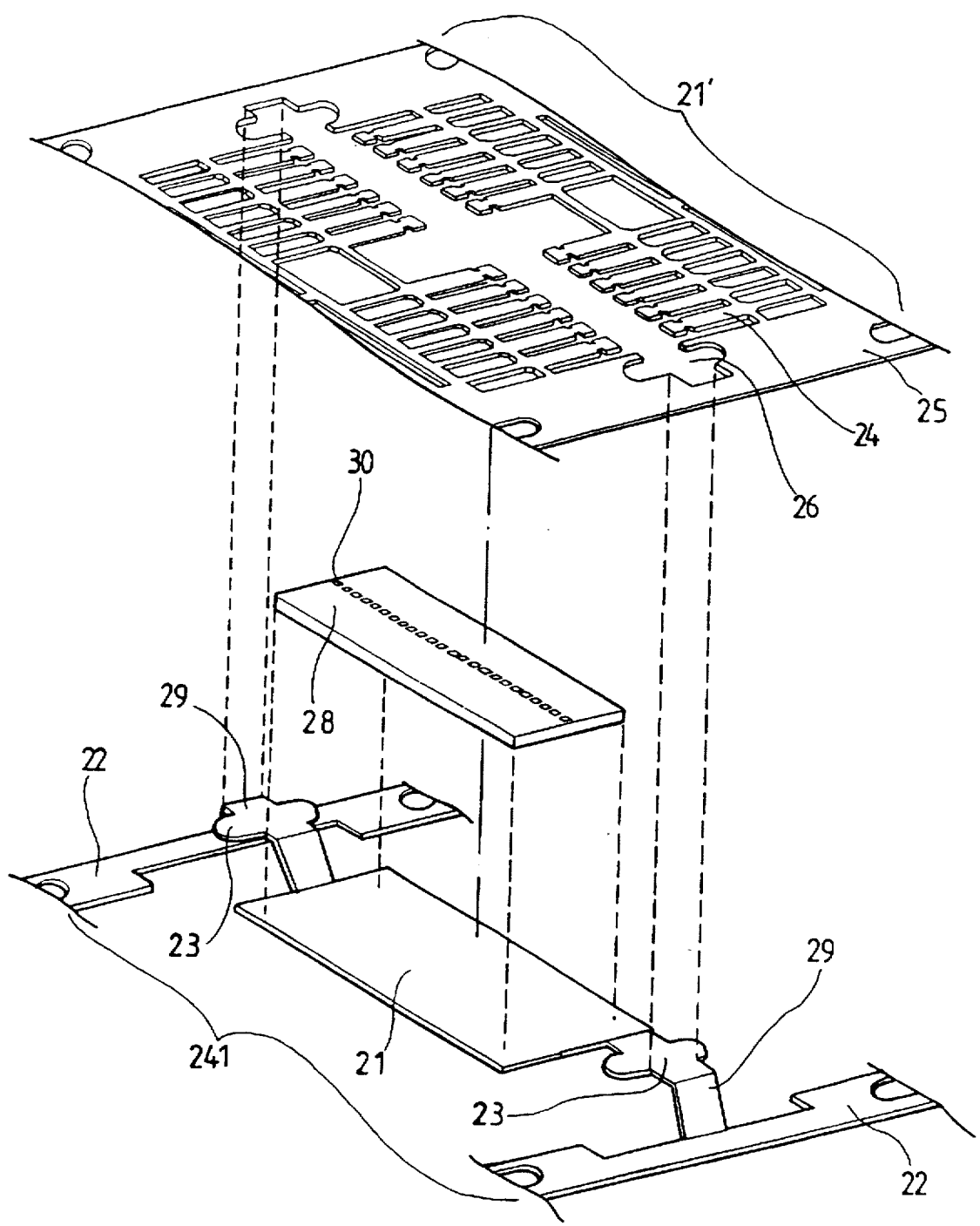
FIG. 7 is an exploded schematic diagram showing the relations among the die pad frame, the semiconductor chip and the lead frame during assembling.

During assembling of the semiconductor chip, the relations among the die pad frame 21', the semiconductor chip 28 and the lead frame 24' are further displayed in FIG. 7 for better understanding of the present invention. The semiconductor chip 28 is first attached adhesively to the die pad 21, then the lead frame 24' is placed on the die pad frame 21', with the positioning protrusions 23 on the die pad frame 24' plugged into the positioning openings 26 of the lead frame 24'. The selvages 22 of the die pad frame 21' are removed along the edges 29, leaving the positioning protrusions 23 completely filling out the positioning openings 26 of the lead frame 24', rendering the two frames assembled with high precision. Consequently, expensive equipment such as high precision mounter in not necessary using the assembling mechanism of the present invention.

Since the positioning protrusions 23 are elevated above the die pad 21, the lead conductors 24 will be suspended on top of the semiconductor chip 28. The height of the positioning protrusions 23 are designed such that the bottom of the positioning protrusions 23 are higher than the top surface of the die pad 21 by approximately the thickness of a semiconductor chip. As a result, the distance between the lead conductors 24 and the bonding terminals on the semiconductor chip can be minimized.

Figure 8:
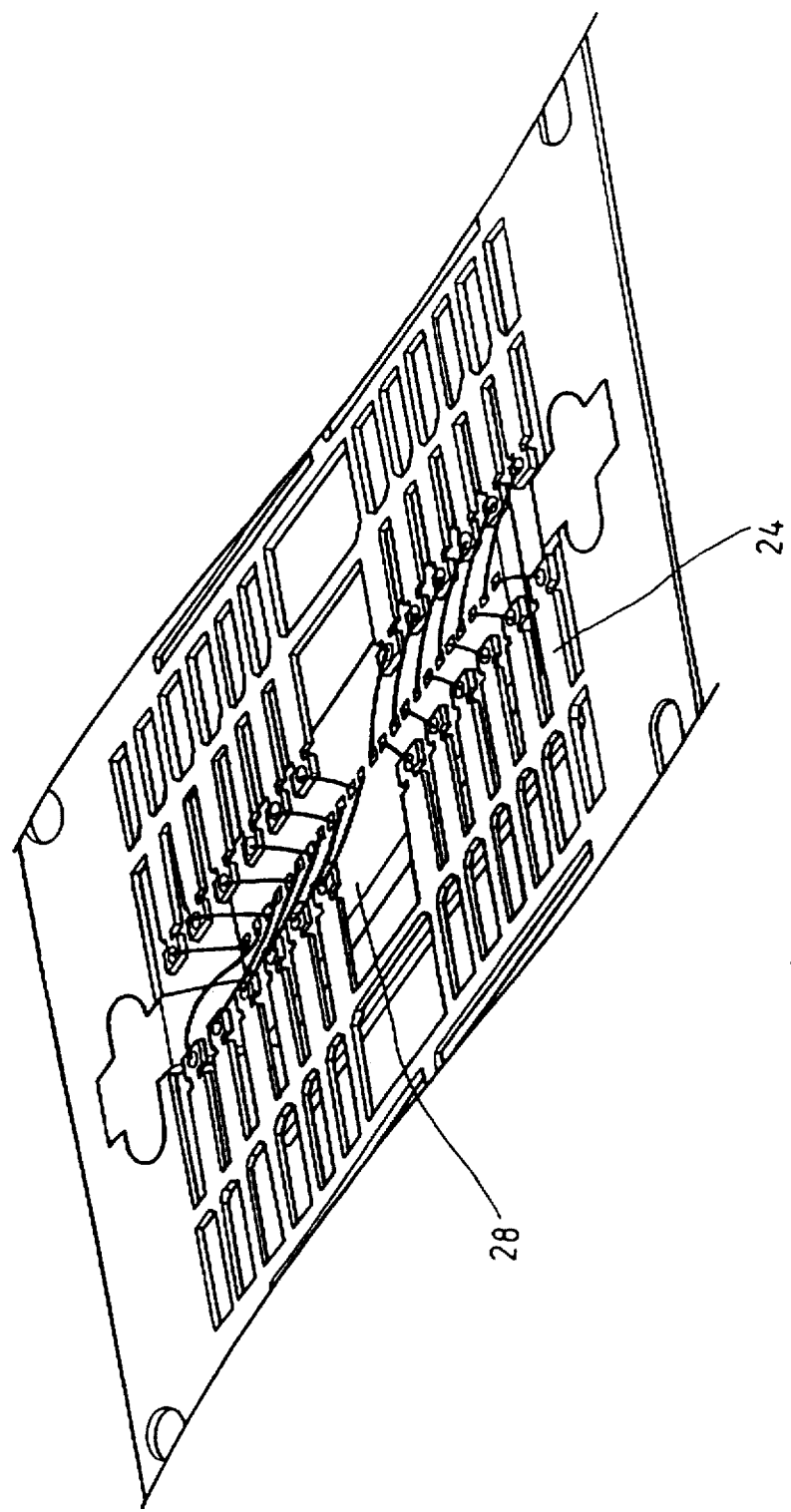
FIG. 8 is a schematic representation of the connection situation of the die pad frame and the lead frame of the present invention, the semiconductor chip being affixed adhesively on the die pad and the lead frame being placed on top of the semiconductor chip with the positioning openings in the lead frame locked and secured to the positioning protrusions in the die pad frame, bonding wires are then applied to connect the lead conductors and the terminals on the semiconductor chip.

FIG. 8 is a three-dimensional representation of the structure of the assembled semiconductor chip of the present invention. After the semiconductor chip 28 is affixed adhesively on the die pad 21 and the lead frame 24' is secured to the die pad frame 21', the lead conductors 24 will extend to the top of the center part of the semiconductor chip 28, hence the distance between the lead conductors 24 and the bonding terminals 30 can be reduced to minimum. After bonding, the entire system is encapsulated in a protection material and the cross members 27 of the lead frame 24' are removed.

From the above description, the present invention provides a simple mechanism for assembling semiconductor chip with high precision and low cost, furnishing improved mechanical, electrical and thermal performance. While the advantageous features of this invention have been described in terms of preferred embodiments, it will be appreciated that various omissions and substitutions in form may be made by those skilled in the art without departing from the spirit of the invention.

What is claimed is:

1. A packaging mechanism for a semiconductor chip comprising:

a die pad formed of metal sheet for supporting one of different types of semiconductor chips, the die pad being fixed by means of selvages at both sides of said die pad to form a die pad frame, said die pad being connected through positioning protrusions to said selvages, said positioning protrusions being higher than the plane of said die pad and said selvages by about the thickness of a semiconductor chip attached to said die pad;

a semiconductor chip having a major surface with bonding terminals thereon disposed within an encapsulating material;

a plurality of self supporting discrete and continuous lead conductors formed of metal sheet extending over said major surface of said semiconductor chip at spaced locations from said bonding terminals and extending from said semiconductor chip and cantilevered out of the encapsulating material;

a wafer coating on the major surface of said semiconductor chip for protecting said semiconductor chip from electrical contact to said lead conductors;

discrete electrical conducting wires bonded to said lead conductors and said bonding terminals and electrically connecting said lead conductors to said bonding terminals; and the encapsulating material being disposed over and enclosing said bonding terminals, said conducting bond wires, and a portion of said lead conductors, the remainder of said lead conductors being cantilevered out of said encapsulating material.

* * * * *